(12) United States Patent
Appinger et al.

(10) Patent No.: US 9,927,463 B2
(45) Date of Patent: Mar. 27, 2018

(54) WAFER PROBE ALIGNMENT

(71) Applicant: INTERNATIONAL BUSINESS MACHINES CORPORATION, Armonk, NY (US)

(72) Inventors: Joerg G. Appinger, Boeblingen (DE); Eberhard Dengler, Boeblingen (DE); Roland Dieterle, Holzgerlingen (DE); Martin Eckert, Boeblingen (DE); Gabriele Kuczera, Boeblingen (DE); Siegfried Tomaschko, Boeblingen (DE); Otto Torreiter, Boeblingen (DE); Quintino Lorenzo Trianni, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 121 days.

(21) Appl. No.: 14/887,510

(22) Filed: Oct. 20, 2015

(65) Prior Publication Data
US 2017/0108534 A1    Apr. 20, 2017

(51) Int. Cl.
*G01R 1/067* (2006.01)
*G01R 1/073* (2006.01)
*G01R 31/28* (2006.01)

(52) U.S. Cl.
CPC ..... *G01R 1/06794* (2013.01); *G01R 1/07307* (2013.01); *G01R 31/2887* (2013.01); *G01R 31/2891* (2013.01)

(58) Field of Classification Search
None
See application file for complete search history.

(56) References Cited

U.S. PATENT DOCUMENTS 4,786,867 A * 11/1988 Yamatsu ............ G01R 1/07342
324/750.22
8,781,779 B2   7/2014 Casler, Jr. et al.
(Continued)

OTHER PUBLICATIONS

Appinger et al., "List of IBM Patents and/or Patent Applications Treated as Related", for U.S. Appl. No. 14/887,510, filed Oct. 20, 2015, dated Feb. 22, 2017 (2 pages).
(Continued)

*Primary Examiner* — Paresh Patel
(74) *Attorney, Agent, or Firm* — Margaret A. McNamara, Esq.; Kevin P. Radigan, Esq.; Heslin, Rothenberg, Farley & Mesiti, P.C.

(57) ABSTRACT

A wafer probe alignment system and method for aligning a probe to a chip wafer for testing a chip on the wafer are provided. At least two corners of the probe are adjustable in a same direction in relation to a primary corner of the probe. The alignment approach includes providing a grid of signal pins for corresponding contact pads of the chip under test, determining for each signal pin whether an electrical contact is established to a corresponding contact pad of the chip under contact force, and adjusting a position of each of the at least two corners by a corner individual delta position value with respect to the direction depending on a result of the determining in order to establish an electrical contact between each of the pins and the corresponding contact pads of the chip under test.

10 Claims, 9 Drawing Sheets

(56) References Cited

U.S. PATENT DOCUMENTS

| 2006/0244438 | A1* | 11/2006 | Strom | ............... G01R 35/00 324/750.01 |
| 2011/0156284 | A1 | 6/2011 | Zhang et al. | |
| 2012/0299610 | A1 | 11/2012 | Bieck | |
| 2013/0169300 | A1 | 7/2013 | Ishikawa et al. | |
| 2014/0070834 | A1 | 3/2014 | Pagani | |

OTHER PUBLICATIONS

Chang et al., "Experimental and Theoretical Investigation of Needle Contact Behavior of Wafer Level Probing", Precision Engineering, vol. 35, Issue 2, (Apr. 2011) pp. 294-301.
Anonymous, "Mechanical Probe Alignment", IP.com Electronic Publication No. IPCOM000212442, Nov. 14, 2011 (2 pages).
Appinger et al., "Wafer Probe Alignment", U.S. Appl. No. 15/176,681, filed Jun. 8, 2016 (38 pages).

* cited by examiner

WAFER PROBE ALIGNMENT

BACKGROUND

The present invention relates generally to wafer probe alignment, and more specifically, to a method, wafer probe alignment system and a computer program product, for aligning a probe to a chip wafer for testing a chip on the wafer.

Wafer testing is a step performed in wafer fabrication and test laboratories using a wafer probe. All chips on a wafer may be tested for functional defects and performance data by applying special test patterns. A probe card or test board with microscopic contacts is installed to the wafer probe while the wafer is held, for example, by vacuum on a chuck and moved into the contacts to established electrical contact between the chip and the test system via the test head.

During test, it is necessary to have electrical contacts for all test signals, and appropriate power connection is required to ensure realistic test results. This requires planarity between test board contacts and the wafer. To assure planarity, a grid of signal pins may be adjusted to the chuck, and thus the wafer surface, by adjusting the top plate of the wafer probe. The test board may also be adjusted to have planarity between the electrical contacts and the test board mechanic. The contacts of the test board may include no moving parts. In this case, planarity is essential. In other cases, the test board may be mounted with some flexibility allowing auto-micro-adjustments.

During wafer test, the chuck moves the wafer into the contact to establish electrical contacts, which requires a certain force depending of the number of contacts. This force may cause mechanical distortion of the wafer probe and top plate of the wafer probe, which may impact the planarity between wafer probe contacts and the wafer and may lead to contact loss of one or several signals, potentially worsening power connections, which could influence the test results. To correct planarity between the wafer and probe contacts, during contacting of the chip on the wafer an adjustment mechanic may be inserted to a top plate of the wafer probe. This adjustment mechanic may be operated, e.g., manually.

SUMMARY

According to one or more aspect of the present invention, a method for aligning a probe to a chip wafer for testing a chip on the wafer is provided. At least two corners of the probe may be adjustable in a same direction in relation to a primary corner of the probe. The method may comprise: providing a grid of signal pins for corresponding contact pads of the chip under test and determining for each signal pin whether an electrical contact may be established to a corresponding contact pad of the chip under contact force. Additionally, the method may comprise adjusting positions of each of the at least two corners by a corner individual delta position value with respect to the direction depending on a result of the determining in order to establish an electrical contact between each of the pins and the corresponding contact pads of the chip under test.

According to one or more other aspects of the present invention, a wafer probe alignment system is provided for aligning a probe to a chip wafer for testing a chip on the wafer. The wafer probe alignment system is adapted for an adjustment of at least two corners of the wafer probe in a same direction in relation to a primary corner of the probe. The wafer probe alignment system comprises a grid of signal pins for corresponding contact pads of the chip under test, a memory, and a processor communicatively coupled to the memory to perform a method of controlling the grid of signal pins comprising: determining for each signal pin whether an electrical contact is established to a corresponding contact pad of the chip under contact force; and adjusting a position of each of the at least two corners by a corner individual delta position value with respect to the direction depending on a result of the determining in order to establish an electrical contact between each of the pins and the corresponding contacts pads of the chip under test.

Furthermore, embodiments may take the form of a related computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

BRIEF DESCRIPTION OF THE DRAWINGS

It should be noted that embodiments of the invention are described herein with reference to different subject-matter. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention will be apparent from the examples any embodiments described herein, but to which the invention is not limited.

Figure 1:
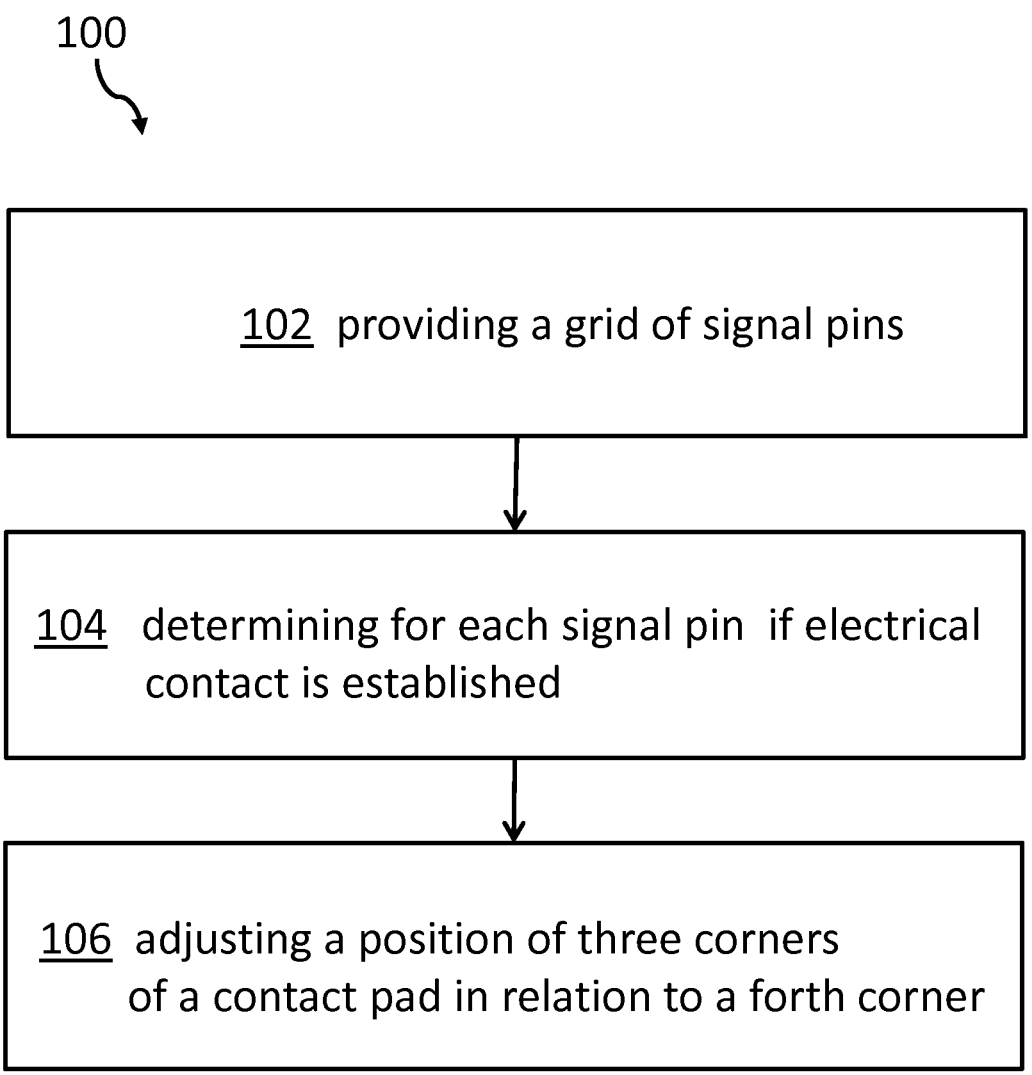
Figure 2:
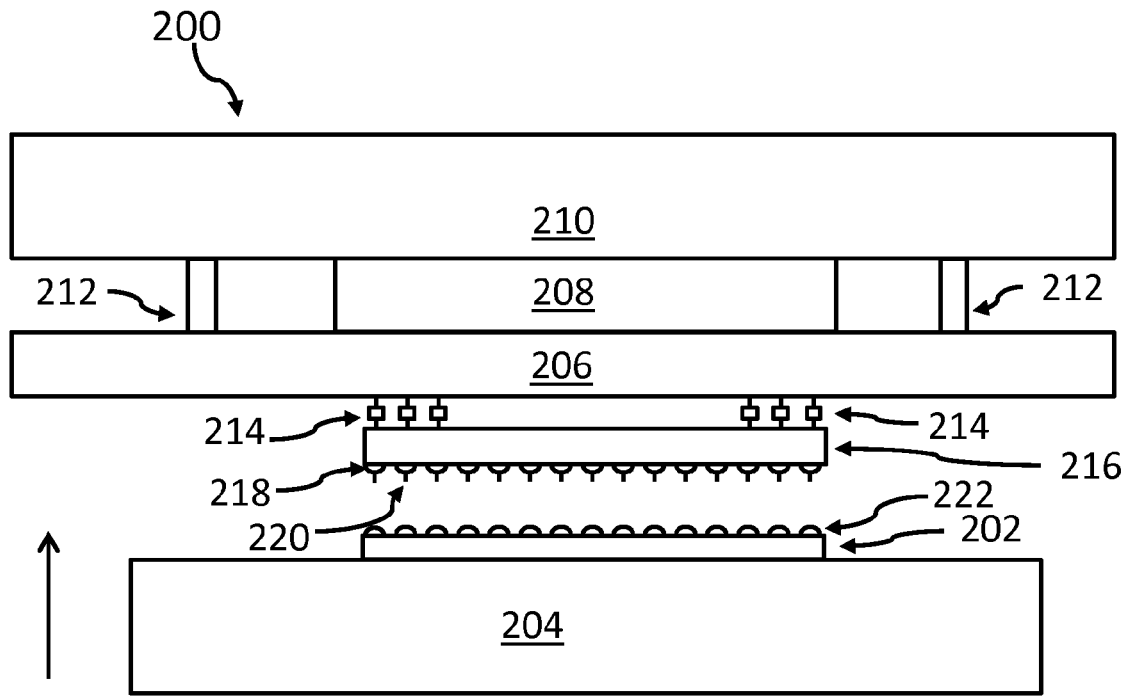
Figure 3:
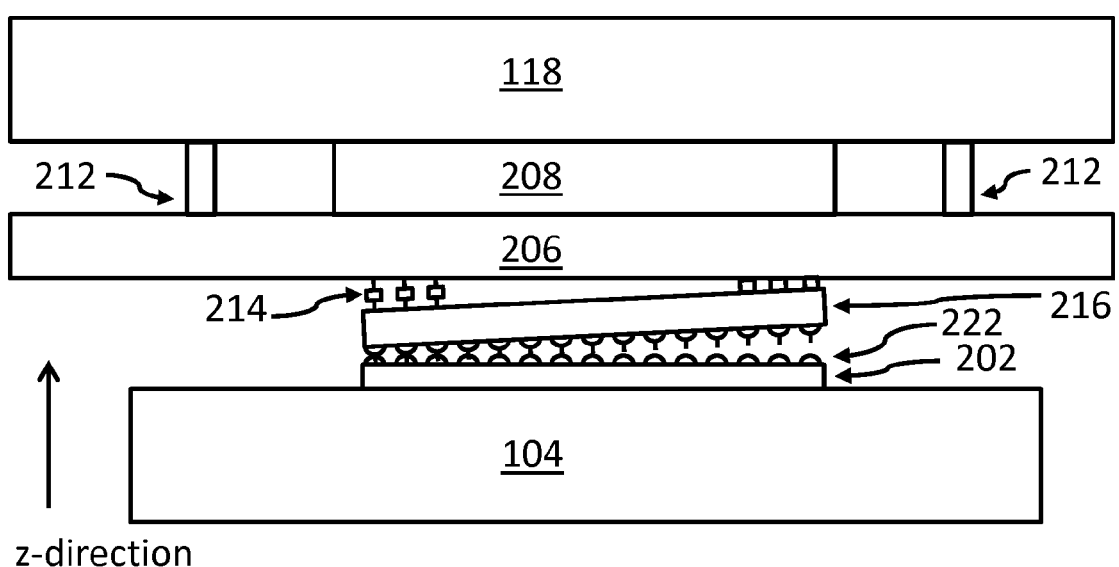
Figure 12:
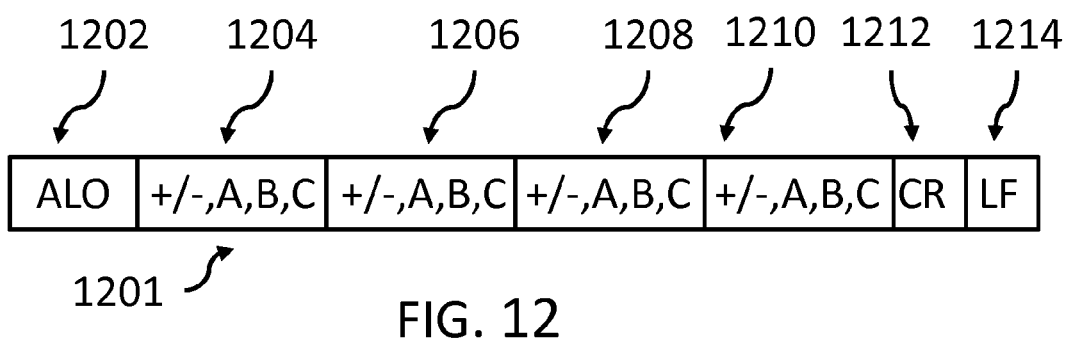
Figure 5:
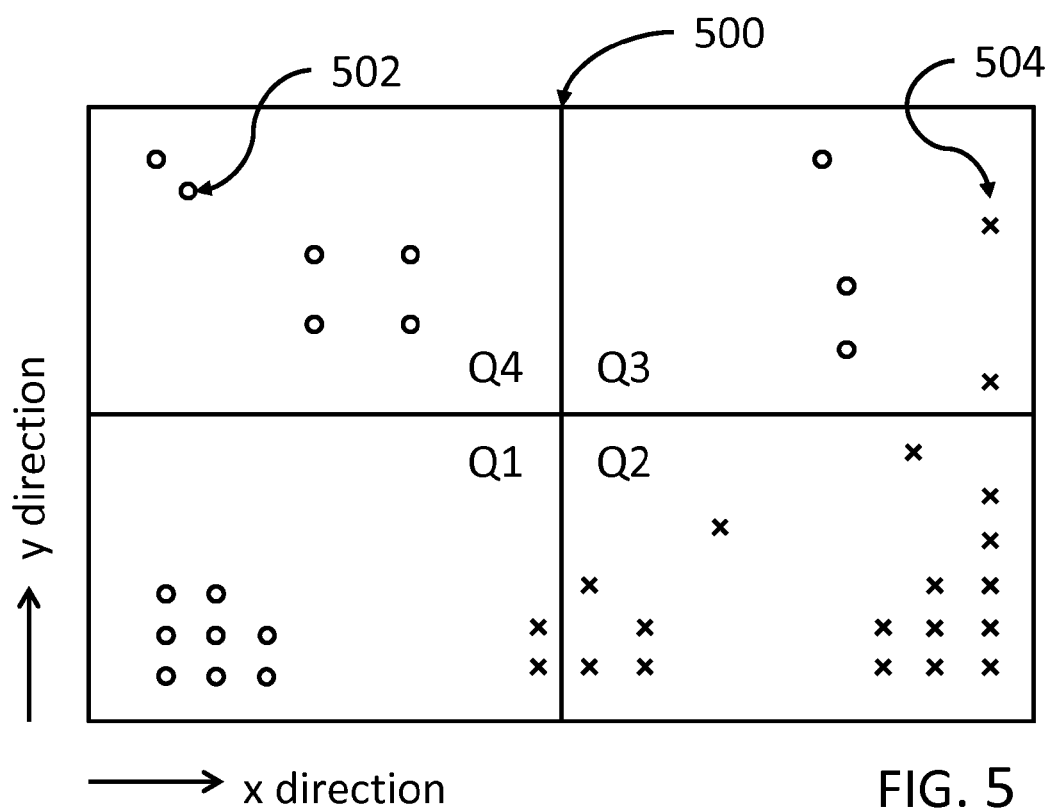
Figure 6:
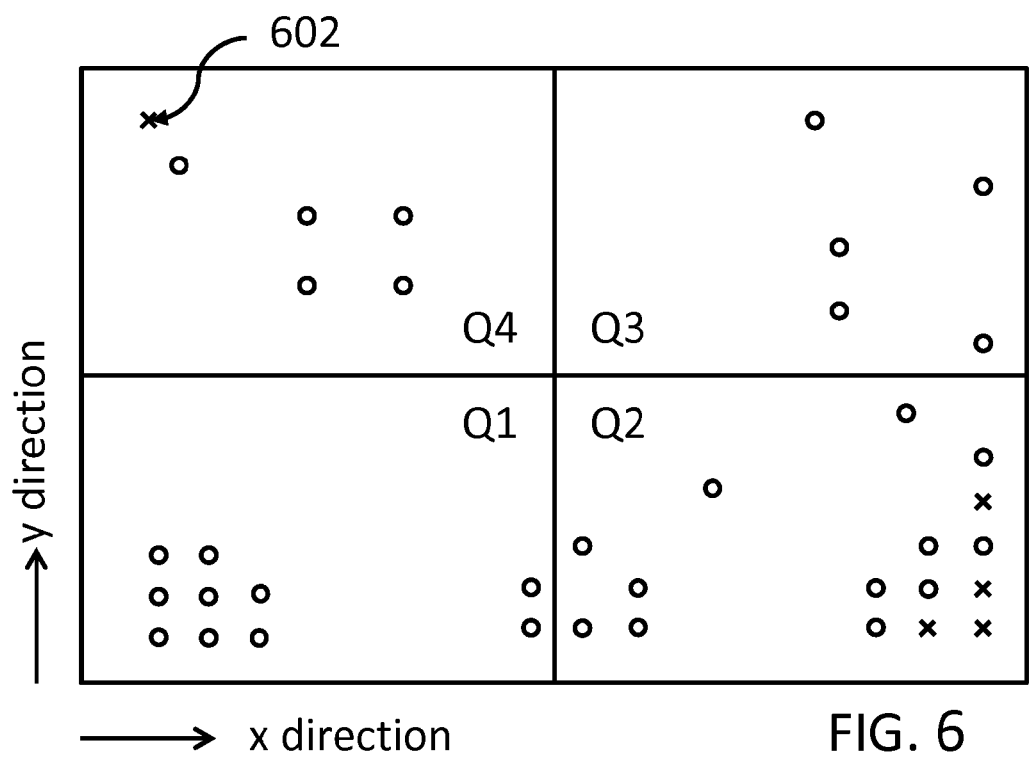
Figure 7:
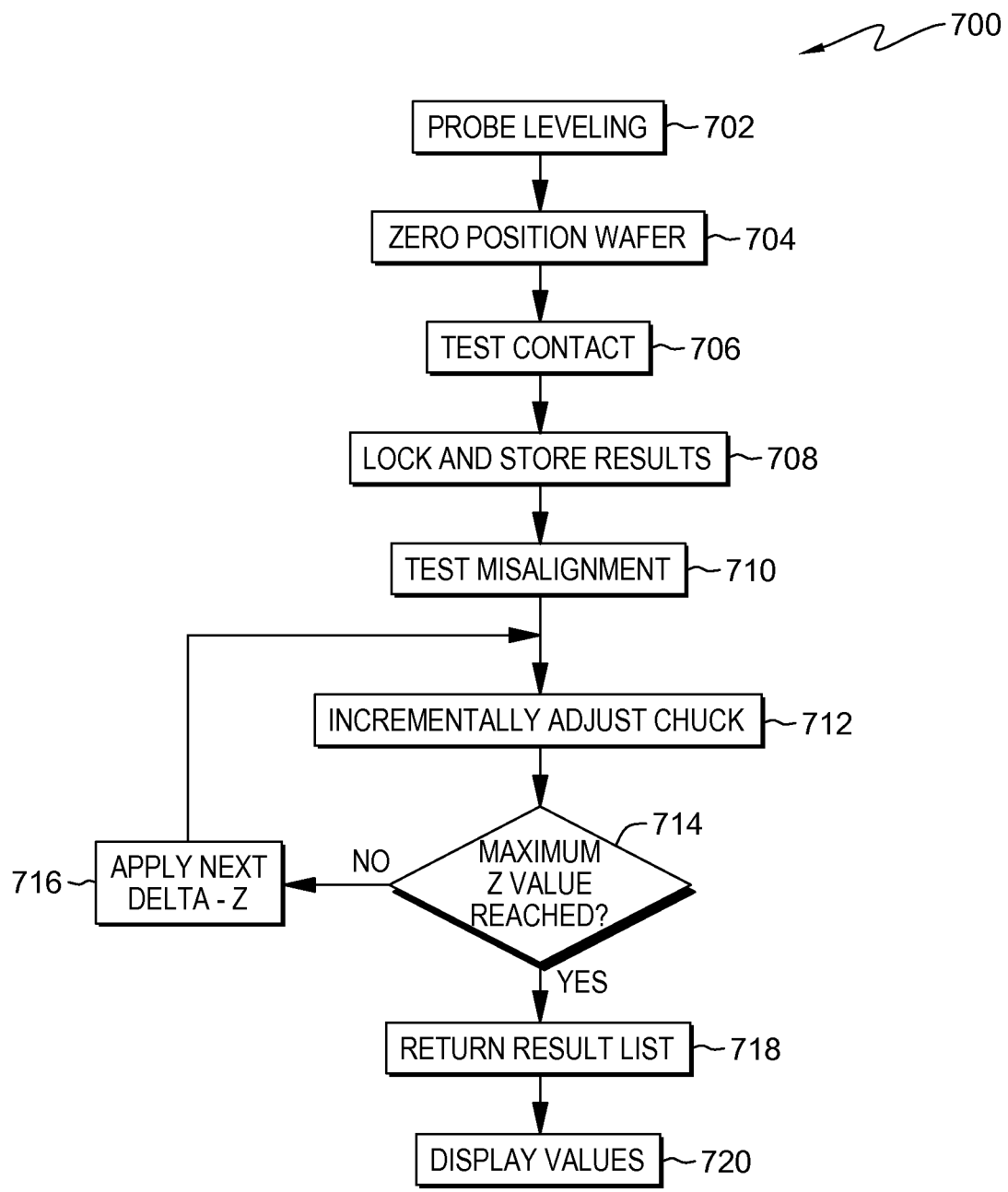
Figure 8:
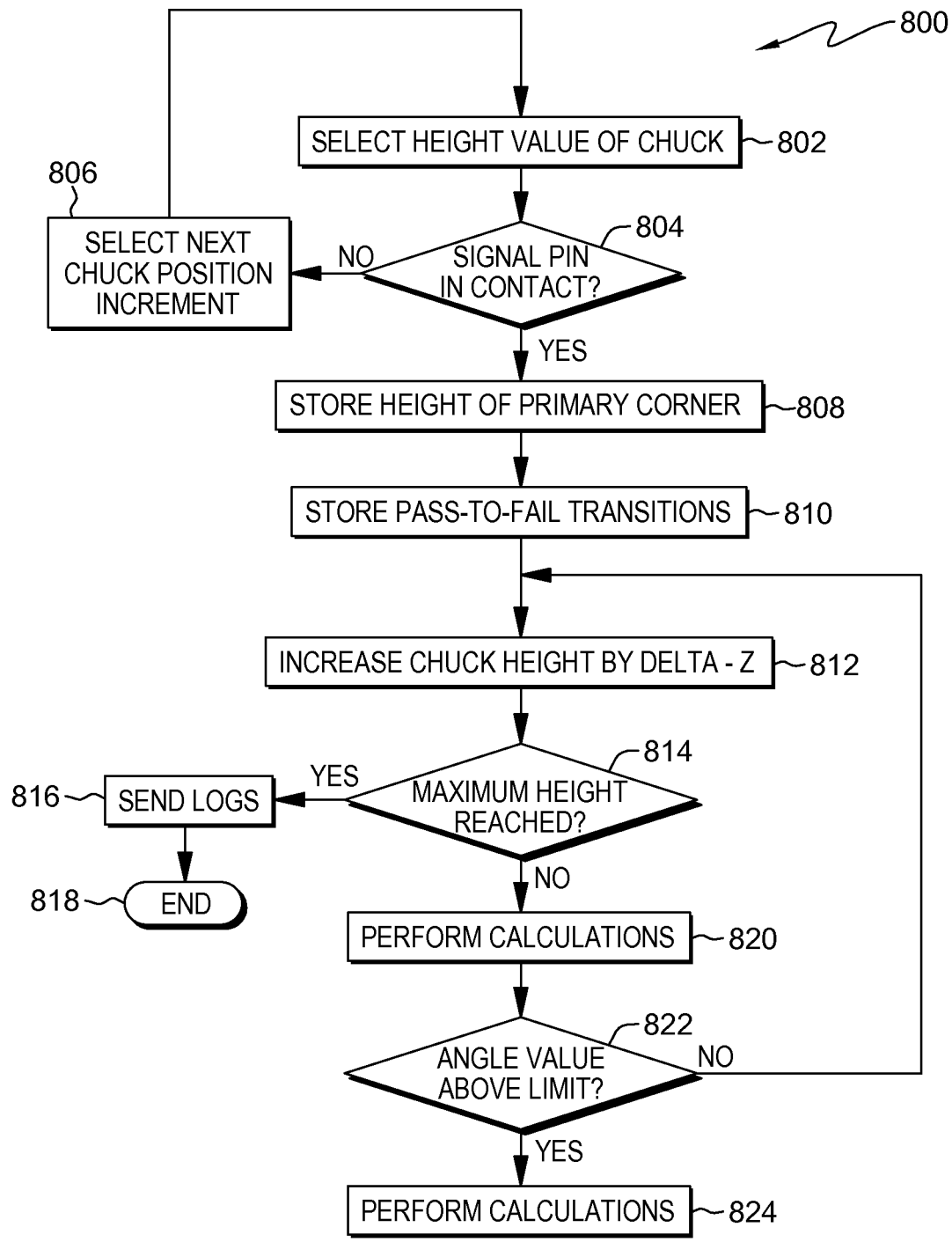
Figure 9:
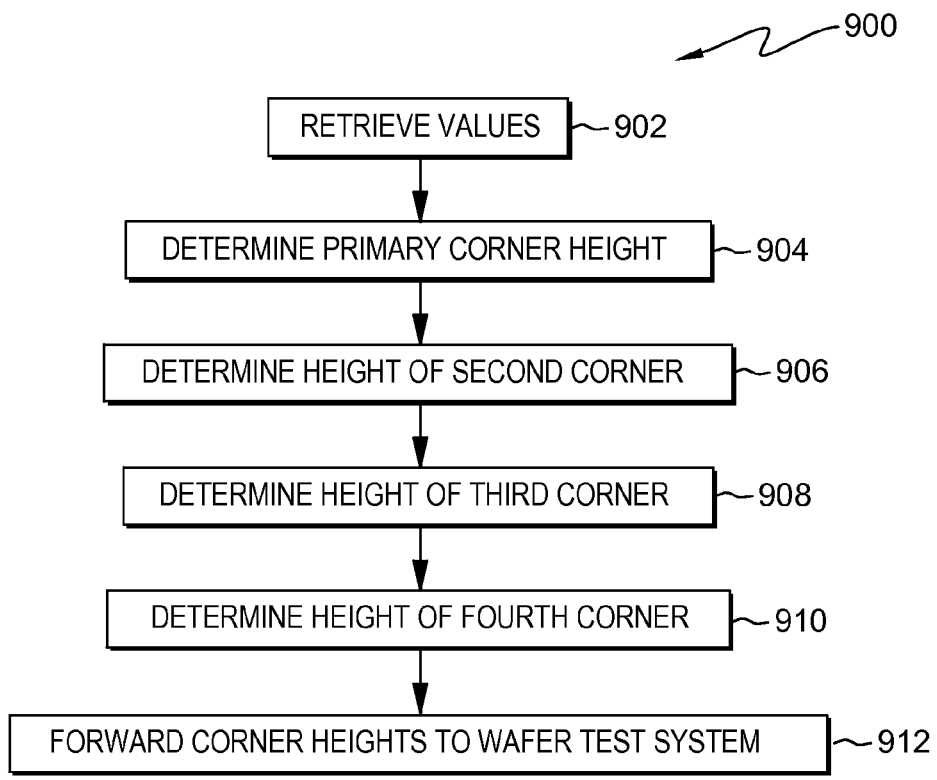
Figure 10:
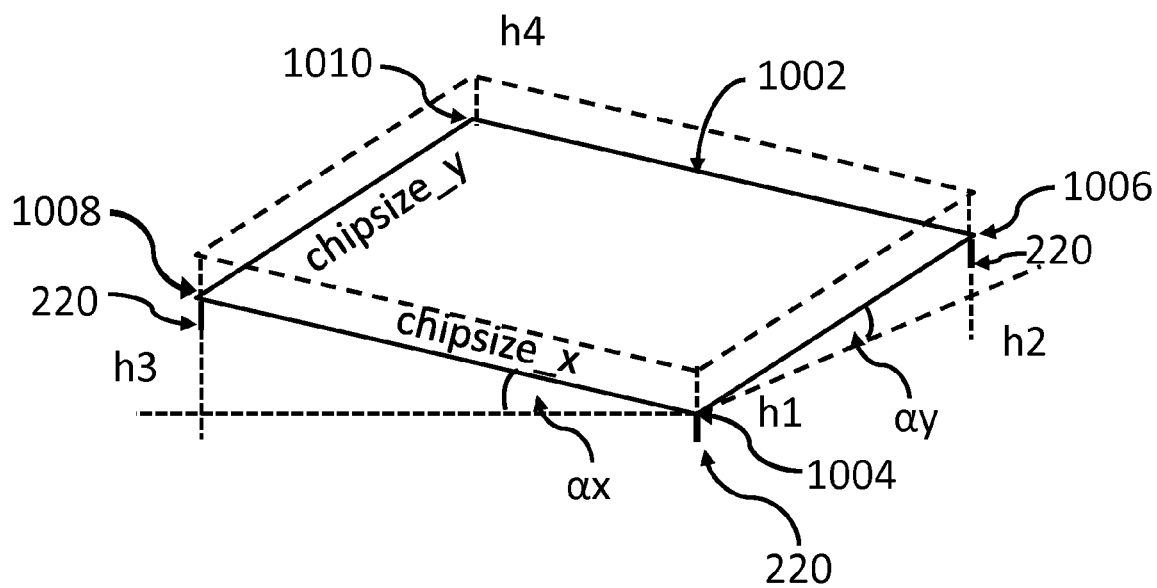
Figure 11:
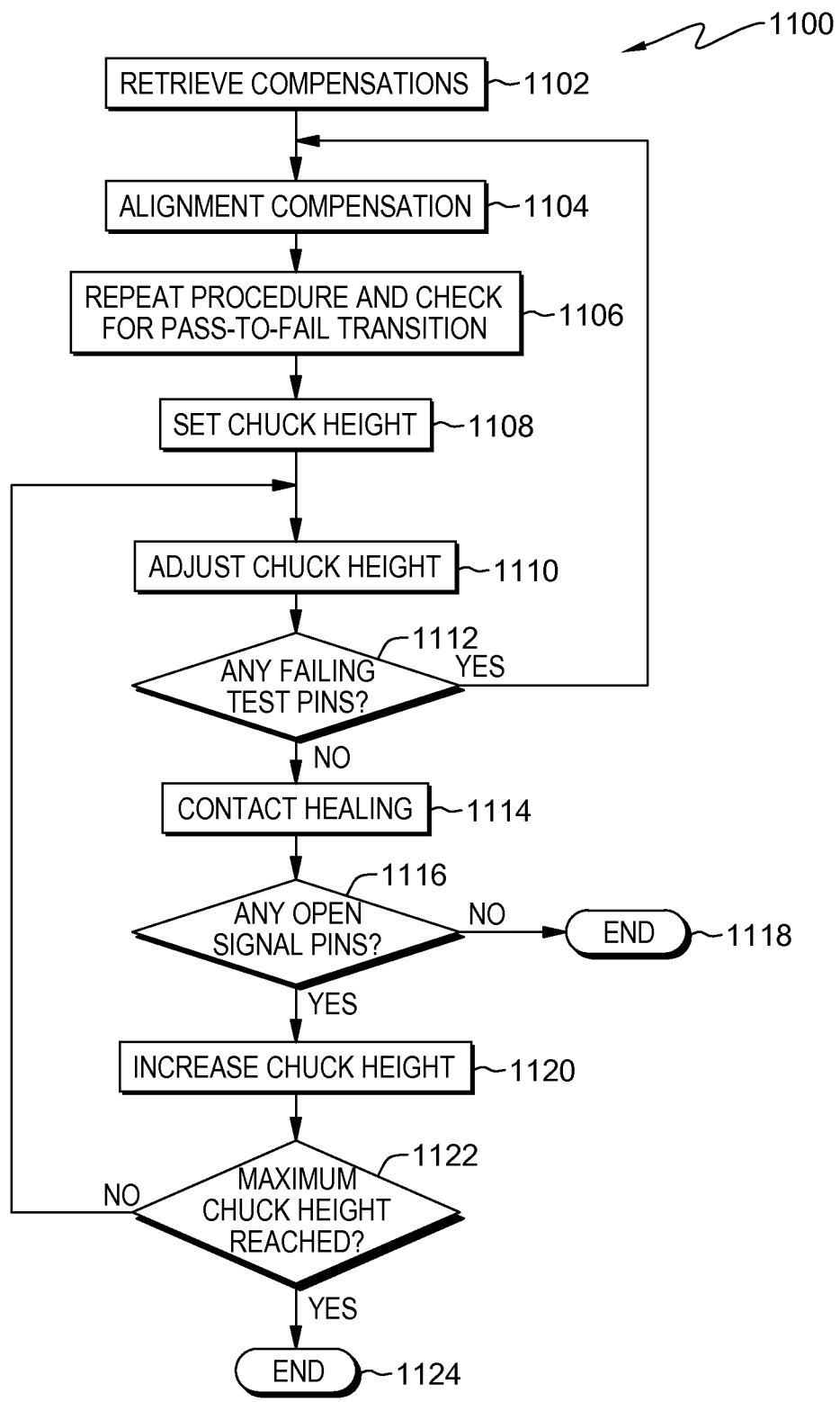
Figure 13:
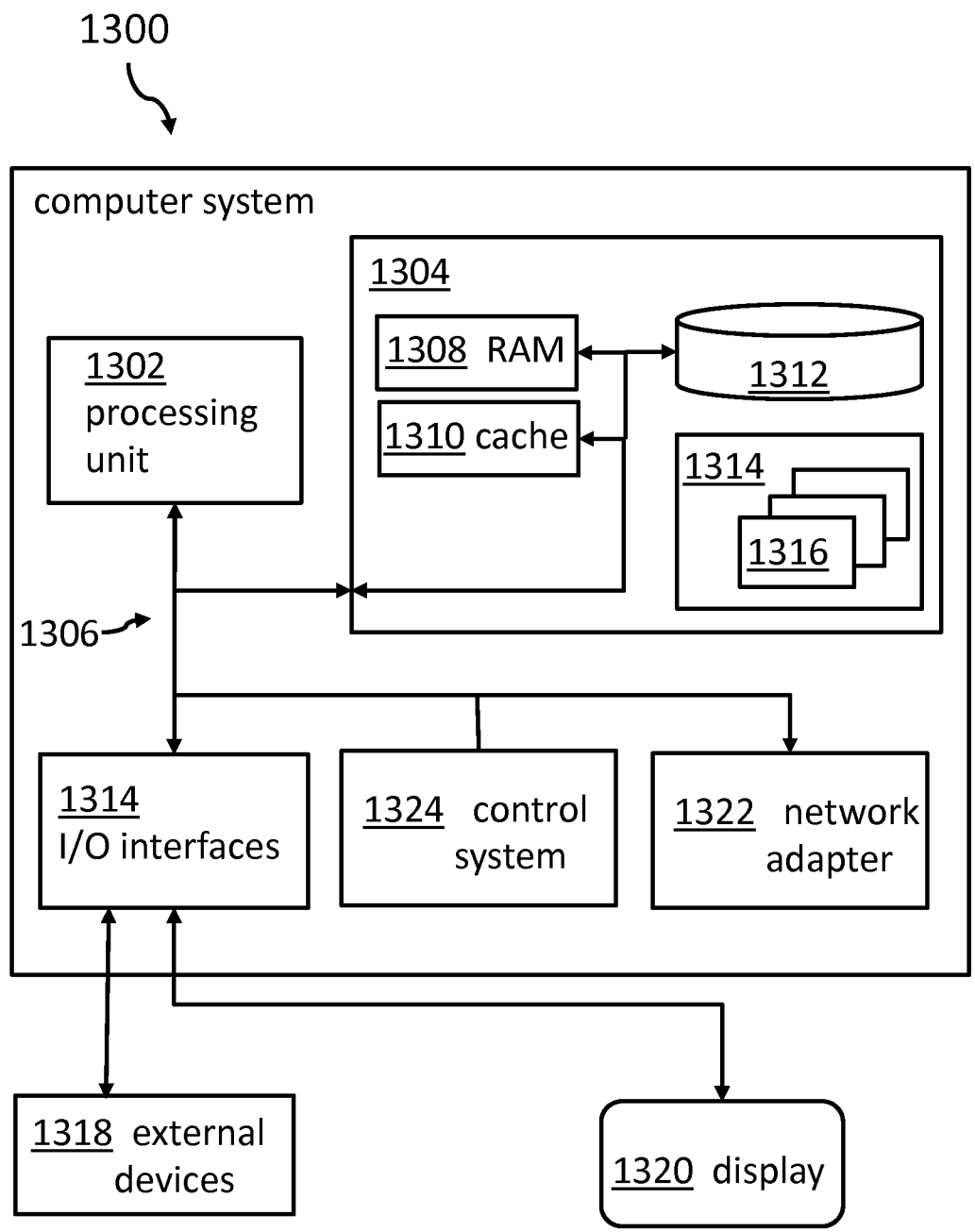

Embodiments of the invention are described below, by way of example only, with reference to the drawings, wherein:

FIG. 1 shows a block diagram of one embodiment of a method for aligning a probe, in accordance with one or more aspects of the present invention;

FIG. 2 shows exemplary portions of a test head and a chip under test before making electrical contact between the signal pins and contact pads of the wafer, in accordance with one or more aspects of the present invention;

FIG. 3 shows the apparatus of FIG. 2, with the test head and the chip under test partially electrical contacting, and to be adjusted in accordance with one or more aspects of the present invention;

FIG. 4A-4D show different possible situations between a signal pin and a contact pad of the chip, to be addressed in accordance with one or more aspects of the present invention;

FIG. 5 depicts a two-dimensional graphical representation of a grid of signal pins which may or may partially not be in contact with corresponding contact pads, and which is to be addressed in accordance with one or more aspects of the present invention;

FIG. 6 shows a situation in which the chuck has been moved to a first position in which not all potential electrical contacts between signal pins and contact pads are made, and which is to be addressed in accordance with one or more aspects of the present invention;

FIG. 7 shows a flow diagram of one embodiment for taking measurements, in accordance with one or more aspects of the present invention;

FIG. 8 shows a flow chart of one embodiment for an angle calculation, in accordance with one or more aspects of the present invention;

FIG. 9 shows a flow chart of one embodiment of the offset calculation in more detail, in accordance with one or more aspects of the present invention;

FIG. 10 shows an example of a tilted plane for a grid of signal pins to be adjusted, in accordance with one or more aspects of the present invention;

FIG. 11 shows a flow diagram of one embodiment of a contact procedure, in accordance with one or more aspects of the present invention;

FIG. 12 shows a potential command string to instruct a test head system how to move the test head in order to allow establishing good electrical contact of the signal pins and the related contact pads, in accordance with one or more aspects of the present invention; and FIG. 13 shows an example computing system suitable for executing program code, in accordance with one or more aspects of the present invention.

DETAILED DESCRIPTION

In the context of this description, the following conventions, terms and/or expressions may be used.

The term 'chip wafer' may denote a semiconductor wafer in which one or more, but typically a plurality of chips or dies have been manufactured. Typically, these chips are rectangular and include a series of contacts for external connections.

The term 'contact pads' may denote the contacts of the chip. Different forms may be possible. Solder balls or in a more precise way, controlled collapse chip connections (C4) are often used. However, the contact pad may also be flat or may have any other form.

The term 'grid of signal pins' may denote a plurality of pins or contacts designed to contact the contacts or contact pads of a chip. A complex chip may comprise hundreds or over one thousand signal pads. The grids of signal pins may either deliver signals to the chip or measure other signals when the chip is under test. A skilled person in the art will understand that each signal pins may correspond to a contact of the chip. However, not every probe may comprise as many signal pins as there are contacts on the chip.

The term 'probe' may denote a carrier system for the grip of signal pins. Often the probe—also called pedestal because it may have such a form—may be formed of a ceramic material. However, this is not a requirement. Other materials may be used as well.

The term 'under contact force' may denote that the grid of signal pins may be establish electrical contacts to corresponding contacts or contact pads of the chip. Assuming that the grid of signal pins is fixed apart from some spring mechanisms, the chip may need to be pushed with a force against the grid of signal pins. For this, a certain force—depending on the number of signal pins—may be required in order to establish electrical contact between all contact pads and corresponding signal pins. The springs may compensate for at least some unevenness between the plane of contact pads and a plane of ends of the signal pins. The high number of signal pins may require a significant force to establish the corresponding contact between signal pins and contact pads.

The term 'adjusting at least two corners' may denote that also three or more corners of, e.g., a probe or pedestal may be adjusted, depending of the geometrical form of the pedestal. It may be assumed that the pedestal is rectangular and one edge may be assumed to be fixed in space, i.e., in x-, y- and z-direction. If two corners—let's assume corner 2 and corner 3—of a stiff pedestal may be moved compared to a first corner—which may be assumed to be fixed—then also the fourth corner of the pedestal may have to be moved. In case the pedestal may have another form than a rectangular form, more or less other corners may have to be moved or adjusted.

The term 'same direction' may denote that only one axis—i.e., positive and negative direction on the axis—may be adjusted for the corners of the pedestal. Here it may be assumed that movement may only be performed in a z-direction. The so implied small delta values in the x- and y-direction of the primary corner fixed in space may be neglected.

The proposed method for aligning a probe to a chip wafer and the related system may offer a number of advantages.

For instance, a good alignment between the grid of signal pins, and in particular backed by a test contactor or pedestal substrate, with a plane of contact pads of a chip as part of a wafer under test, may be achieved. Also, certain drawbacks of existing solutions may be overcome; for example, it may no longer be required to use a thin foil between the wafer and the underlying chuck in order for a good alignment between the grid of signal pins and the contact pads. Such foils may be used in traditional aligning approaches. Using a foil may be error-prone and limited to discrete steps of foil thickness. A manual adjustment of a probe socket may only be possible when the probe head is not covered, i.e., is not in use. Also, a manual adjustment of the test board may impact the mechanical stability of the entire probe head system. A reconnection between the contact pads and the signal pins may not be guaranteed to be successful.

The sometimes used vibration—which may also be used in traditional approaches—for a better contact between the plurality signal pins and the plurality contact pads is not wanted because it may not be allowed to move the test system during operation. This may result in faulty test results.

A sometimes used optical alignment is an indirect measurement which may be used for a pre-alignment, but which may not be optimized towards a target variable, like an impedance of power connections. Additionally, an optical alignment may not guarantee that an electrical contact has been made between a signal pin and a contact pad of the chip if either the single pin or the contact pad may be covered by, for example, an oxide.

Thus, measuring the direct electrical contact and adjusting the grid of signal pins on, for example, a test contactor in form of a pedestal substrate under contact force in real-time, thereby compensating mechanical tolerances of parts of the test, such as the test board, may be achieved.

Furthermore, the method disclosed herein may, as a consequence, allow to burn potentially present oxide, either on a signal pin or a contact pad, by an overvoltage under a defined safe and constant contact current. This is possible because the proposed method allows for indications that such a covering oxide may be present.

Furthermore, the disclosed method may allow use of already available equipment for adjusting the grid of signal pins by enhancing a test head according to the state-of-the-art for an interpretation of an additional command for adjusting at least two, typically three corners of the pedestal carrying the grid of signal pins in comparison to a fourth corner of the pedestal.

In the following, a detailed description of the figures will be given. All instructions in the figures are schematic. Firstly, a block diagram of an embodiment of the inventive method for aligning a probe to a chip wafer for testing a chip on the wafer is given. Afterwards, further embodiments, as well as embodiments of the wafer probe alignment system, will be described.

FIG. 1 shows a block diagram 100 of an embodiment of a method for aligning a probe, in particular a pedestal with attached signal pins, to a chip wafer for testing a chip on the wafer, for example, for functional defects and performance data by applying specific test patterns and measuring results, wherein at least two corners of the probe are adjustable in a same direction in relation to a primary corner of the probe. Here, for example, a rectangular chip as well as a rectangular pedestal may be assumed. The method may include providing, 102, a grid of signal pins, in particular signal pins attached to the probe or pedestal for corresponding contact pads of the chip under test. A 1:1 relationship between signal pins and contact pads may not be required. The number of signal pins may be lower than the number of contact pads because, for instance, only a limited number of tests may be applied, which may require less electrical contacts between signal pins of the test system and available contact pads of the chip (for example, C4s, see below).

The method may further include determining, 104, for each signal pin if an electrical contact is established to a corresponding contact pad of the chip under force. Under force may denote that a certain force may be applied between the contact pads chip and the signal pins in order to ensure proper electrical contacts. One way of measuring an electrical contact between the signal pin and a corresponding contact pad is to measure a voltage over a protection diode available for contact pads (ESD protection diode=electrostatic discharge protraction diode).

Furthermore, the method may include adjusting, 106, a position of each of the at least two corners by a corner individual delta position value with respect to the direction depending of a result of the determination in order to establish an electrical contact between each of the pins and their corresponding contact pads of the chip under test. The direction may be the z-direction. Final results of the alignment process may be stored for a test board because the results may be individual for each test board. They may be used again if the test board may be reinstalled in a test head.

According to an embodiment of the method, the determining and the adjusting may be performed in a repetitive manner until an electrical contact is established between each of the signal pins and their corresponding contact pads of the chip under test. Thereby, the position of each of the at least two corners—in a rectangular case three corners— may be adjusted at each incremental step. Optionally, it may be possible to perform the adjustment only at the end of the incremental steps. This may lead to another release step in which the applied force may be relaxed in a way that still all contacts may be established.

In one or more advantageous embodiments, a pre-aligning may be performed. This may pre-align the grid of signal pins with the signal pads without an electrical or mechanical contact between any signal pin and its corresponding contact pad. This may be performed, for example, in an optical way. The alignment may be performed in an x- and y-direction and also in an angle around the z-axis. There may also be a horizontal pre-alignment step normal to the x-y-plane of the chip surface and/or the pedestal.

According to one or more other embodiments, a mapping of electrical contacts between each of the signal pins and the corresponding contact pads of the chip under test for each of the incremental steps may be stored. Thus, it may be visible that under a stronger contact force an electrical contact may be opened again. The mappings may also be used for process optimization purposes.

According to one or more further embodiments, there may also be a calculating a first and a second angle along edges from the primary corner to a corresponding adjacent corner of the primary corner depending on the mapping. The first and second angle may be determined using a base position of the primary corner and a base position of the at least two corners before any adjustment step and a current corner individual delta position value for the corresponding adjacent corners. The angle calculations may be based on the relative z-coordinate of the corner in relation to the primary corner which is assumed to be fixed in space.

An additional embodiment of the method may include generating a warning signal if one of the first or second angle is above a corner individual threshold value. Thus, no over-stretching the mechanics of the involved apparatus may be provoked.

According to one or more embodiments, the mapping may be categorized in four quadrants of the grid of signal pins. It may be assumed that the field or array of signal pins may be implemented as a rectangular. This way, a number of electrical contacts per quadrant may be determined and compared.

According to an alternative embodiment, the mapping may be categorized in more than four segments of the grid of signal pins. The ultimate scenario may be described in a way that every signal pin may be positioned in one segment. However, due to performance and other practical reasons a four quadrant scenario may be advantageous.

One or more embodiments may include displaying the mapping of electrical contacts between each of the signal pins and their corresponding contact pads of the chip under test. A green dot may, e.g., symbolize an established contact and a red dot on a screen may symbolize a situation in which no contact has been established between a signal pin and its corresponding contact pad on the chip.

FIG. 2 shows one embodiment 200 of parts of a test head and a chip on the test before making electrical contacts between signal pins and contact pads of the wafer. The chip 202 is shown on a chuck 204 which may be moved in a z-direction, that is, up and down. It may be noted that only one chip 202 is shown here. A skilled person in the art will understand that the shown chip 202 may represent only one chip 202 of a larger wafer being placed on the chuck 204.

Above, a part of a test head is shown. A test board 206 is backed by a back plate 208. It may be noted that the test board 206 may have high manufacturing tolerances and may not have a completely parallel upper and lower surface as shown here. Instead, the test board 206 may have relative and even surfaces and have a different thickness at different positions of the test board 206. It may also be flexible to a certain degree if under pressure. This flexibility may be compensated by the back plate 208 which may be supported by a bridge beam 210. Additionally, the test board 206 may be supported by distance orders 212 between the test board 206 and the bridge beam 210.

Below the test board 206, a plurality of pogo pin springs 214 are shown. The elasticity may typically be in a range of about 0.1 mm. However, these pogo pin springs 214 may not allow for a complete compensation of present test board tolerances. Attached to the pogo pin springs 214 may be a test contactor plate or pedestal substrate, or in short pedestal 216. On the lower side of the pedestal a plurality of ball contacts 218 are shown. At the highest point of these ball contacts 218 small pins 220 are shown. These are adapted to get an electrical connection to contact pads 222 of the chip 202. It may be noted that the contact pads are also shown as a contact ball to make them better recognizable. However, these contact pads 222 may in reality have a more flat structure.

FIG. 3 shows parts of the test head and the chip on the test with partial electrical contact. As mentioned above, manufacturing tolerances (not shown) of, for example, the test board 206, may result in only partial electrical contact between the plurality of contact pads 222 and corresponding signal pins 220 of the pedestal 216. FIG. 3 shows only contacts on the left side of the grid of signals pins 220. The pogo pin springs 214 may be compressed in an uneven way due to, e.g., the deficiencies of the test board 206. As shown, the pogo open springs 214 and potentially other alignment mechanisms may not allow a complete compensation of a potential misalignment between the pedestal 216 and thus, the signal pins 220 and the contact pads 222 of the wafer 202. In the example shown, only a limited number of signal pins 220 are in mechanical and potentially electrical contact with the contact pads 222. It may be clear to a skilled person that the shown row of contact pads 222 and the line of shown signal pins 220 may also extend into a direction vertical to the figure plane and thus building a two-dimensional grid of signal pins 220 and contact pads 222. It may also be understandable by a skilled person that the transition from the situation shown in FIG. 2 to the situation in FIG. 3 has been achieved by moving the chuck 204 upwards in the z-direction.—It may also be noted that certain obvious reference numerals of FIG. 2 have not been repeated in FIG. 3.

Figure 4A:
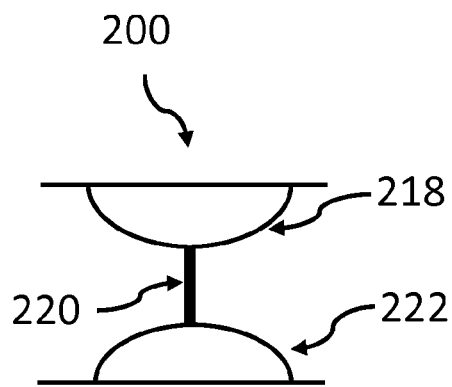
Figure 4B:
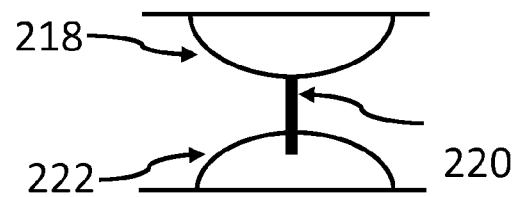
Figure 4C:
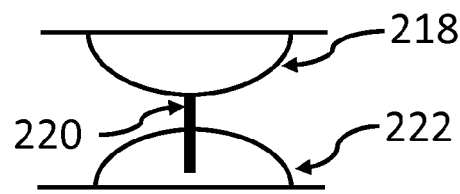
Figure 4D:
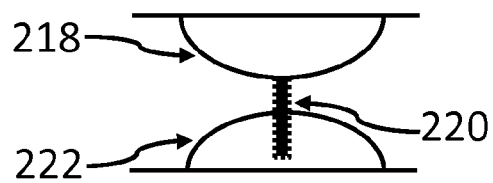

FIGS. 4A-4D show different situations (magnified in comparison to FIGS. 2 and 3) between a signal pin 220 of a contact for 218 and a contact ball or contact pad 222 of the chip 202. If, as shown in FIG. 4B, the signal pin 220 may have been moved partially into the contact pad 222, a good electrical contact in the sense of a comparably low contact resistance is made. The situation in FIG. 4C may represent an even better electrical contact. The situation in FIG. 4A may represent a worse electrical contact if compared to the situation in FIG. 4B. The situation in FIG. 4D may represent no electrical contact because, e.g., an oxide (shown as a dashed line) may be present on the surface of the signal pin 220 shown as dashed line. This may prevent any electrical contact between the signal pin 220 and the contact pad 222 of the chip 202.

FIG. 5 shows a two-dimensional graphical representation 500 of a grid of signal pins 220 (FIG. 2) which may or may partially not be in contact with corresponding contact pads 222 (FIG. 2). Circles, like the cycle 502 of which only one is enumerated, may represent an electrical contact between a signal pin 220 and its corresponding contact pad 222. A cross, like a representative example cross 504, may represent a signal pin 220 and a corresponding contact at 222 having no electrical contact. It is also shown that the grid of signal pins 220 may be separated into different segments, here four quadrants Q1, Q2, Q3, Q4. It may also be possible to choose a different segmentation approach with more than four segments. Ultimately, each signal pin 220 may be represented by its own segment. More realistic cases would group a number of signal pins 220 into one segment. However, the underlying alignment method may still be equivalent.

FIG. 6 represents a situation in which the chuck 204 (FIG. 2) has been moved to a first position in which not all potential electrical contacts between signal pins 220 and contact pads 222 are made. The chuck 204 with the wafer 202 (FIG. 2) may be moved further into the direction of the test head such that a higher sum force may be applied between the grid of signal pins 220, i.e., the pedestal 216 and the wafer 202. A plurality of such check movement positions may be represented by a different number of electrical contacts between signal pins 220 and corresponding contact pads 222. Displaying a graphical representation of the two-dimensional array of signal pins 220, like the one shown in FIG. 5 and FIG. 6, may enable an operator to follow in real-time a potentially growing number of electrical contacts under upwards movement of the chuck 204. Thus, for each movement step in the z-direction of the chuck 204, another contact mapping may be displayed and it may also be stored where electrical contacts have been established and where not. In a realistic case, electrical contacts may be color-coded: for example, green dots for electrical contacts and red dots for signal pins 220, which may not be in contact with corresponding contact pads 222 of the wafer 202. It may be noted that due to testing efficiency not always all potential positions for signal pins may be used because only a limited number of tests may be performed for the chip 202. The positions and the number of contact pins may vary from test scenario to test scenario.

It may also be noted that in the transition from the situation shown in FIG. 5 and FIG. 6 different corners of the pedestal 216 may have been moved individually, corner by corner, in order to get more signal pins 220 electrically contacted to their corresponding contact pins 222. Such an individual movement of different corners of the pedestal 216 may result in a better alignment between the chip 202 surface and the plane of grid of the signal pins 220. Three of four corners of the pedestal 216 may be moved in a relation to a primary corner. In FIG. 5 and FIG. 6 it may be assumed that the origin of the display plane—i.e., the lower left corner—may be the primary corner. This may correspond to a situation where the lower right corner may be fixed in space.

It may also be noted that—if FIG. 6 is compared to FIG. 5—the originally top left established electrical contact 602 is now—in FIG. 6—no longer in electrical contact. This situation may happen if after an incremental step the test board (or also the pedestal with the signals pins) bends, so that an already established electrical contact gets lost again. The storing and mapping process will take care of such pass-to-fail transitions.

FIG. 7 shows a flow diagram 700 for taking measurements. Firstly, a base adjustment in the axis' x-, y-, z-direction of the test equipment—or probe leveling—may be performed, 702. The wafer 202 (FIG. 2) may be moved up by the chuck 204 (FIG. 2) to a "zero" position in which the chip and the test head, i.e., a first signal pin may be moved to a touch position, 704. A test "contact open/short" or "contact open/closed" and a forward-bias-test may be performed, 706. Instrumental for the forward-bias-tests may be ESD (electrostatic discharge) protection diodes which may be measured for a given constant test current. Typically, each contact pad of the chip may be protected by such ESD protection diodes. All results of the individual forward-bias-test for each signal pin and the relating forward-bias-voltage may be locked and stored, 708.

Optionally, a first misalignment angle αx and potentially a second misalignment angle αy may be calculated and tested against a maximum angle that may be performed in order to prevent too high mechanical stress in the system during the measurement, 710. In a next step, 712, the chuck 204 may be moved upwards in the z-direction by a delta-z. A test may be made whether the maximum z-value may have been reached, 714. In case of no, the next delta-z may be applied, 716, and all measurement results may be logged again. In case of "yes", the entire result list with electrically open contact, electrical shorts and forward-bias-test results will be returned, 718. Then, each layer, that is, data values for every z-height may be graphically displayed, 720, as shown in FIG. 5 and FIG. 6. Optionally, those contacts that have lost electrical contact to signal pin 222 may have a corresponding contact pad 222 highlighted. This may show, for instance, that something went wrong when applying the next delta-z of the chuck 204.

FIG. 8 shows a flow chart 800 for an angle calculation. Starting from a minimum height at the "zero" position, a layer, i.e., a height value of the chuck 204 (FIG. 2) may be picked, 802. It may be checked, 804, whether a first signal pin 220 (FIG. 2) was found having good contact with its corresponding contact back 222 (FIG. 2). In case of "no", a next increment of the chuck 204 position is selected, 806. In case of "yes", the height "h" of the primary corner, which is closest to the first contact/region is stored, 808. For this, the highest passing rate for signal pins 220 in contact with corresponding contact pads 222 per quadrant Q1, Q2, Q3, Q4 or per segment is used.

For each signal pin 228, non-contact/contact transition—equivalent to fail-to-pass transition—may be stored additionally, a pass-to-fail transition may be stored, 810. This may be an indication of a bending of the grid of signal pins 220, i.e., the underlying pedestal 216 or the test board.

Again, the height of the chuck 204 may be increased, 812, by a delta-z value. It may be checked, 814, whether the last element "h", that is, the maximum height of the chuck 204 may be reached. In case of "yes", calculated angles and offset compensations and measurement logs may be sent, 816, to a database per test board 206. Then, the calculation may be stopped, 818. In case of "no", a series of calculations may be performed, 820:

Angles αx and αy may be calculated as a function of the height H: β (f(h), wherein x and y may represent two orthogonal edges of the chip 202 of pedestal 216. One angle, both or none may be Zero. This may be achieved by picking two signal pins per direction (or a minimum h in quadrants Q2 and Q4, respectively versus Q1 and Q3, respectively for edge 2 or Q1/Q2 vs. Q3/Q4 for edge 1) which are somehow away and identify a delta h for their first contact: α=arctan (delta-h/dist).—Another possibility would be to take the average a across all heights.

Also a height of the compensation for all corners may be calculated (compare FIG. 9). All signal pins 220 per quadrant Q1, Q2, Q3, Q4 may be watched. All signal pin statuses (pass vs. fail) may be stored per quadrant. When the last electrically not connected signal pin 220 gets contact the corresponding height of the chuck 204 is also stored.

Then, it may be checked whether one of the angle values is above a predefined limit, 822. This maximum angle may be predefined if one of the angles would imply a higher difference from one corner to the other than the pogo pin springs 214 may tolerate. In case of "no", the process may return back to incrementing, 812 the height h by a delta-h for the next layer. In case of "yes", the following may be performed: calculating, 824 a new up-limit based on αx or αy which may lead to generating a maximum height of the test board 206 and pedestal 216. It may be noted that there may exist a maximum variable pogo pin spring 214 length which must not be exceeded.

FIG. 9 shows a flow chart 900 one embodiment of the offset calculation in more detail. As a first step, 902, angles and offset compensation values may be fetched from the database for a dedicated test board 206 in use. A height h1 for the primary corner is determined, 904, for which a first contact between a signal pin 220 and a corresponding contact at 222 has been determined:

h1=z (of first contact).

Then, 906, h2 for the second corner may be calculated as h2=h1+chipsize_x*sin(αx). Then, 908, h3 from the third corner may be calculated as h3=h1+chipsize_y*sin(αy). Next, 910, h4 for the fourth corner may be calculated as h4=h1+chipsize_x*sin(αx)+chipsize_y*sin(αy). A function call may be issued, 912, to the software of the wafer test system (not shown), handing over the heights h1, h2, h3, h4 (details are discussed in the context of FIG. 12).

FIG. 10 shows an example of a tilted plane 1002 for a grid of signal pins 220. It may be noted that the signal pins 220 are below the visible surface of plane 1002 which may represent the lower surface of the pedestal 216. It may also be assumed that h1<h2<h3<h4 in the z-direction. Corner 1004 may be called the primary corner which may be fixed in comparison of the other corners, in particular the adjacent corners 1006, 1008, as well as the diagonal corner 1010 in at least a vertical direction for one of the incremental steps. A base position may be marked by the horizontal line from the corner 1004 to the corner 1008 and another line from the corner 1004 to the corner 1006. In case h1=h2=h3, as a consequence, also h4 would be equal to h1, h2 and h3.

In case the plane may be tilt of an angle αx is formed along the edge chipsize_x between a tilted position of the plane 1002 and the base position, as just described. A comparable angle αy may be built for the other edge of the pedestal.

The chipsize may be the widest distance between contact pads of the chip in any relevant direction. There may also be a small error when the signal pins 220, and thus the plane 1002 gets a tilt. It depends on the signal pin 220 length. In a practical example, it may be about 1.3 μm per 1° in α, if a signal pin length of 80 μm may be assumed. This error may be neglected for short needles, or compensated with the wafer x/y correction after each step-and-repeat, i.e., a next wafer under the pedestal 216. h1 may denote that the pedestal 216 needs to have at least this height such that the signal pin or the needle "drilling" into the contact pad 222 (compare FIG. 4B, 4C) in order to get good contact. This may be called "overdrive" because the signal pins 220 are not only touching the surface of the related contact pad 222 for an electrical contact but "dive" into the volume of the contact pad.

FIG. 11 shows a flow diagram 1100 of one embodiment of a contact procedure, in accordance with one or more aspects of the present invention. In a first step, 1102, angles and offset compensations are fetched from a database for a dedicated test board 206 (FIG. 2) in use. Then, 1104, a test board 206 and pedestal 216 (FIG. 2) alignment may be compensated by the amount of an offset identified for the four corners. Next, 1106, the procedure according to FIG. 6 may be redone. If one or more signal pins 220 (FIG. 2) may not have an electrical contact to their corresponding contact pads 222 (FIG. 2), it may be checked whether there was one or more pass-to-fail transitions. Then, 1108, the chuck 204

(FIG. 2) may be moved to the height of contact plus a predefined value, e.g., 50 µm. This may be seen as a security increase and also to compensate for a chip to chip tolerance in a step-and-repeat process.

Next, 1110, the chuck may be adjusted in a z-direction by delta h and the contact test may be run again. Next, 1112, it may be tested whether there are still open signal pins 220 (FIG. 2) or signal pins 220 with a pass-to-fail transition and/or a forward-bias-test showing a value greater than a maximum predefined value. In case of "yes", the process moves back to the step of the compensation of the test board alignment 1104.

In case of "no" the contact healing may be tried, 1114, with an overvoltage but a safe constant current for that specific signal pin 220. The overvoltage may, e.g., be 9V with the current of 0.1 mA.

Next, 1116, it may be tested whether there are still open signal pins. In case of "no", the procedure may end, 1118. In case of "yes", the height h of the chuck 204 may be increased, 1120, by a delta-h. If a maximum height may be reached, 1122,—case of "yes"—the contact procedure may be stopped, 1124, since no successful result has been achieved and/or the procedure is not converging. In case of "no", the process returns back to the step of moving, 1110, the chuck 204 by a delta-h value.

It may be noted that the loop from block 1112 to block 1104 may be repeated until an iteration limit may be reached.

FIG. 12 shows a potential command string 1201 to instruct a test head system how to move the test head in order to allow the signal pins 220 establish good contact between the signal pins 220 and the related contact pads 222. The command string 1201 may be adaptable for different probe systems. Here, it may be shown in a form compatible with an automatic wafer probe, e.g., called Precio nano from a company named Tokyo Electron Limited.

The field 1202 of the command string 1201 may define a new command 1202 which may be called "auto level override" or ALO. It may be sent from the inventive wafer probe alignment system to e.g., the automatic wafer probe Precio nano or a compatible system. The other fields in detail may be:

1204: height h1 in form of $+/-10^2, 10^1, 10^0$
1206: height h2 in form of $+/-10^2, 10^1, 10^0$
1208: height h3 in form of $+/-10^2, 10^1, 10^0$
1210: height h4 in form of $+/-10^2, 10^1, 10^0$
1212: a carriage return byte in ASCII format
1214: a line feed byte in ASCII format.

Thus, an automatic wafer probe may be instructed by a wafer probe alignment system to better align the grid of signal pins 220 with corresponding contact pads 222 of a chip 202 under test, under contact force.

Embodiments of the invention may be implemented together with virtually any type of computer, regardless of the platform being suitable for storing and/or executing program code. FIG. 13 shows, as an example, a computing system 1300 suitable for executing program code related to the proposed method.

The computing system 1300 is only one example of a suitable computer system and is not intended to suggest any limitation as to the scope of use or functionality of embodiments of the invention described herein. Regardless, computer system 1300 is capable of being implemented and/or performing any of the functionality set forth hereinabove. In the computer system 1300, there are components, which are operational with numerous other general purpose or special purpose computing system environments or configurations.

Examples of well-known computing systems, environments, and/or configurations that may be suitable for use with computer system/server 1300 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 1300 may be described in the general context of computer system-executable instructions, such as program modules, being executed by a computer system 1300. Generally, program modules may include routines, programs, objects, components, logic, data structures, and so on that perform particular tasks or implement particular abstract data types. Computer system/server 1300 may be practiced in distributed cloud computing environments where tasks are performed by remote processing devices that are linked through a communications network. In a distributed cloud computing environment, program modules may be located in both local and remote computer system storage media including memory storage devices.

As shown in the figure, computer system/server 1300 is shown in the form of a general-purpose computing device. The components of computer system/server 1300 may include, but are not limited to, one or more processors or processing units 1302, a system memory 1304, and a bus 1306 that couples various system components including system memory 1304 to the processor 1302. Bus 1306 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 1300 typically includes a variety of computer system readable media. Such media may be any available media that is accessible by computer system/server 1300, and it includes both, volatile and non-volatile media, removable and non-removable media.

The system memory 1304 may include computer system readable media in the form of volatile memory, such as random access memory (RAM) 1308 and/or cache memory 1310. Computer system/server 1300 may further include other removable/non-removable, volatile/non-volatile computer system storage media. By way of example only, storage system 1312 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 1306 by one or more data media interfaces. As will be further depicted and described below, memory 1304 may include at least one program product having a set (e.g., at least one) of program modules that are configured to carry out the functions of embodiments of the invention.

Program/utility 1314, having a set (at least one) of program modules 1316, may be stored in memory 1304 by way of example, and not limitation, as well as an operating system, one or more application programs, other program modules, and program data. Each of the operating system, one or more application programs, other program modules, and program data or some combination thereof, may include an implementation of a networking environment. Program modules 1316 generally carry out the functions and/or methodologies of embodiments of the invention as described herein.

The computer system/server 1300 may also communicate with one or more external devices 1318 such as a keyboard, a pointing device, a display 1320, etc.; one or more devices that enable a user to interact with computer system/server 1300; and/or any devices (e.g., network card, modem, etc.) that enable computer system/server 1300 to communicate with one or more other computing devices. Such communication can occur via Input/Output (I/O) interfaces 1314. Still yet, computer system/server 1300 may communicate with one or more networks such as a local area network (LAN), a general wide area network (WAN), and/or a public network (e.g., the Internet) via network adapter 1322. As depicted, network adapter 1322 may communicate with the other components of computer system/server 1300 via bus 1306. It should be understood that although not shown, other hardware and/or software components could be used in conjunction with computer system/server 1300. Examples, include, but are not limited to: microcode, device drivers, redundant processing units, external disk drive arrays, RAID systems, tape drives, and data archival storage systems, etc.

Additionally, a control system 1324 for controlling the wafer probe alignment system may be attached to the bus system 1306. This control system may also be adapted to interface with the automatic wafer probe.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A wafer probe alignment system for aligning a pedestal to a chip wafer for testing a chip on the wafer, the wafer probe alignment system comprising:
    the pedestal including multiple corners, and a grid of signal pins for contacting corresponding contact pads of the chip under test;
    a memory;
    a processor communicatively coupled to the memory to perform a method of controlling the grid of signal pins during probe alignment, wherein the wafer probe alignment system is adapted for an adjustment of at least two corners of the pedestal in a same direction in relation to a primary corner of the pedestal, the method comprising:
        identifying the primary corner as a corner of the multiple corners of the pedestal closest to a region of the pedestal first to contact the chip under test;
        determining for each signal pin whether an electrical contact is established to a corresponding contact pad of the chip under contact force; and
        adjusting a position of each of the at least two corners relative to the primary corner along one or more axes in relation to the primary corner and according to a predetermined offset value for each of the at least two corners depending on a result of the determining in order to establish an electrical contact between each of the pins and the corresponding contact pads of the chip under test.

2. The wafer probe adjustment system of claim 1, wherein the determining and the adjusting are performed in a repetitive manner until an electrical contact is established between each of the signal pins and the corresponding contact pads of the chip under test, thereby adjusting the position of each of the at least two corners at each incremental step.

3. The wafer probe alignment system of claim 1, further comprising pre-aligning the grid of signal pins to the signal pads without an electrical or mechanical contact between any signal pin and its corresponding contact pad.

4. The wafer probe alignment system of claim 2, further comprising storing a mapping of electrical contacts between each of the signal pins and the corresponding contact pads of the chip under test for each of the incremental steps.

5. The wafer probe alignment system of claim 4, further comprising calculating a first and a second angle along edges from the primary corner to a corresponding adjacent corner of the primary corner depending on the mapping, wherein the first and second angle are determined using a base position of the primary corner and base positions of the at least two corners before any adjustment of the corresponding adjacent corners.

6. The wafer probe alignment system of claim 5, further comprising generating a warning signal whether one of the first or second angle is above a corner individual threshold value.

7. The wafer probe alignment system of claim 4, wherein the mapping is categorized in four quadrants of the grid of signal pins or in more than four segments of the grid of signal pins.

8. The wafer probe alignment system of claim 4, further comprising a displaying the mapping of electrical contacts between each of the signal pins and their corresponding contact pads of the chip under test.

9. The wafer probe alignment system of claim 2, further comprising:
- addressing an open electrical contact between a signal pin and a corresponding contact pad when a maximum of incremental steps is reached by applying a predefined overvoltage to the signal pin of a with a predefined constant current.

10. A computer program product for aligning a pedestal to a chip wafer for testing a chip on the wafer, wherein the pedestal comprises multiple corners and a grid of signal pins for contacting corresponding contact pads of the chip under test, the computer program product comprising a non-transitory computer readable storage medium having program instructions embodied therewith, the program instructions being executable by one or more computing devices to cause the one or more computing devices to perform a method comprising:
- determining for each signal pin whether an electrical contact is established to a corresponding contact pad of the chip under contact force; and
- generating adjustment signals for adjusting a position of each of at least two corners of the multiple corners of the pedestal by a predetermined offset value in a direction depending on a result of the determining in order to establish an electrical contact between each of the signal pins and the corresponding contact pads of the chip under test.

* * * * *